US005541368A

United States Patent [19]
Swamy

[11] Patent Number: 5,541,368
[45] Date of Patent: Jul. 30, 1996

[54] LAMINATED MULTI CHIP MODULE INTERCONNECT APPARATUS

[75] Inventor: N. Deepak Swamy, Austin, Tex.

[73] Assignee: Dell USA, L.P., Austin, Tex.

[21] Appl. No.: 276,221

[22] Filed: Jul. 15, 1994

[51] Int. Cl.$^6$ ............................... H05K 1/09; H05K 1/03
[52] U.S. Cl. .................. 174/266; 174/257; 174/258; 174/262; 361/760; 361/762
[58] Field of Search ........................... 174/250, 256–257, 174/258, 259, 260, 262, 266; 328/179, 180.1, 180.2; 361/760, 762, 784

[56] References Cited

U.S. PATENT DOCUMENTS

| | | |
|---|---|---|
| 4,706,167 | 11/1987 | Sullivan . |
| 4,979,676 | 12/1990 | Dibugnara . |
| 5,179,501 | 1/1993 | Ocken et al. . |
| 5,300,461 | 4/1994 | Ting . |
| 5,311,059 | 5/1994 | Banerji et al. . |
| 5,319,159 | 6/1994 | Watanabe et al. . |

*Primary Examiner*—Laura Thomas
*Attorney, Agent, or Firm*—Richard Konneker; James Huffman

[57] ABSTRACT

To facilitate the reworking of a multi-tiered circuit board and a laminated multi chip module, a chip module apparatus having a substrate portion is provided. The chip module has first and second opposite sides with vias extending therethrough. Deposited on both sides of the module by conventional processes is a layer of copper. A first mask is applied to the copper layer to expose a copper, electrical circuit pattern. A second mask having holes therein that are offset from the vias is placed over the first mask by conventional processes. Formed on at least one of the chip module's side in the second mask's holes are a spaced series of an solder BGAs, which have melting point temperatures substantially greater than the phase transition temperature of the chip module's substrate portion. The BGA's are formed on the chip module by an electrochemical plating process.

23 Claims, 2 Drawing Sheets

LAMINATED MULTI CHIP MODULE INTERCONNECT APPARATUS

BACKGROUND OF THE INVENTION

The present invention relates generally to an integrated circuit module and more particularly is related to a laminated multi chip module having a ball grid array thereon.

For many years it has been customary to employ printed circuit boards ("PCBs") or printed circuit assemblies ("PCAs") as mediums for mechanically holding electronic components together and providing operative electrical interconnections between the components. The earliest PCBs were constructed of an insulating planar substrate (such as a glass fiber/resin combination) upon which a layer of conductive metal was deposited. The metal coating layer typically covered the entire surface of the substrate and was subsequently etched by a chemical process to form from the initial metal coating layer a predetermined pattern of conductive "traces" on the side surface of the substrate. Often, these electrically conductive traces were formed on both sides of the substrate to allow conductors to cross without coming into contact with one another. A plurality of mounting holes or "vias" were drilled through the metal layer(s) and the substrate, and were appropriately positioned to receive leads from the electronic components. This method of mounting electrical components on a circuit board is commonly referred to as "through-hole" mounting.

To complete assembly of a circuit board, the electronic components were placed on the PCB, either by hand or robotic machine, with the leads of the components passing through corresponding vias. Finally, solder connections were made to ensure reliable electrical contact between the components and the traces.

Initially, soldering was performed manually. Subsequently, more efficient machine-soldering techniques employing infrared ovens or solder baths were developed to speed manufacture of circuit boards and to ensure higher solder joint reliability. Under such machine-soldering techniques, the PCB and its components were heated while solder, under the influence of flux, was caused to contact the board and flow by capillary action into the vias, yielding a low resistance solder joint when cooled.

As circuit board technology developed, designers began to create circuit boards comprising many alternating substrate and conductive layer pairs, resulting in sandwiched circuit boards that could accommodate a higher component density. Such boards could accommodate ten or more conductive layers. Later, surface-mount technology allowed the leads to be soldered to solder pads on the surface of the circuit board, rather than requiring the leads to pass through vias to be soldered therein.

In addition to this circuit board construction evolution, the electronic components themselves underwent changes to accommodate higher density. First, discrete components were combined into integrated circuits ("ICs"). ICs were originally placed in dual in-line packages ("DIPs") each consisting of an elongated plastic body encapsulating the IC and a plurality of electrical leads coupled to the IC and arranged in a series extending from the two long edges of the body. The leads could either be through-hole soldered or surface-mounted. Unfortunately, the number of leads that a DIP could accommodate was a function of twice the length of the DIP body edges. Some improvement was made by providing packages having leads extending from all four edges of the body, but, even so, the number of leads was a function of the perimetral length of the body edges.

Next, in an effort to increase lead density further (to address, in particular, the increasing power and density of microprocessors and the stringent space requirements of notebook, subnotebook and personal digital assistant ("PDA") computers), designers developed quad flat packs ("QFPs") comprising a generally square body having leads extending downward from the lower surface of the body. The leads were typically arranged in multiple rows and columns, allowing the QFPs to accommodate more pins than DIPs. However, limitations in socket size and collective lead insertion force began to be problematical.

Currently, designers are focussing on ball grid array ("BGA") packaging wherein leads are dispensed with and replaced with a finely-pitched matrix of conductive contact surfaces on the lower surface of an otherwise conventional body. The circuit board to which a BGA package is to be mounted is conventionally provided with a matrix of corresponding surface mounted flat pad structures upon each of which is deposited a small quantity of solder. To mount the BGA package to the circuit board, the BGA package is temporarily clamped to the board and the board heated (typically by application of infrared energy), causing the solder to melt, fusing the corresponding surfaces together and yielding a strong mechanical and electrical connection when cooled.

In connecting a BGA electronic component package to the circuit board, the BGA package is typically placed on the appropriate side of the circuit board, using a high accuracy "pick and place" machine, in a manner such that the ball shaped solder portions of the BGA package contact the flat, surface mount pads which have solder paste screened onto them. The partially completed circuit board/BGA package structure is then subjected to an infrared solder reflow process to metallurgically and hence, electrically couple the surface pads to the ball shaped solder portions of the BGA package.

As is well known in the circuit board art, BGA packages that are soldered onto printed circuit boards using standard surface-mount technology are difficult to rework because when the BGA and corresponding pads are heated to a temperature sufficient to remove the multi chip module (MCM), the uniformity of the ball is typically destroyed in the reheating process. These limitations exist, of course, with single chip packages that have BGA mounting arrays on their undersides. Additionally, they are present, and even more undesirable, in more complex and expensive laminated multi chip module (MCM-L) packages having BGA mounting arrays built onto the undersides of their substrate portions. Currently, MCM-L's have BGA mounting arrays made of 63/37 Sn-Pb solder on the bottom surface which are then attached to the subsidiary package using the standard mount technology methods discussed above. These BGA arrays are either plated onto the surface of the MCM-L during the pattern plating operation at the bare board level or are screened on to the bottom surface metallurgy by a stencil and then infrared or vapor phase reflowed at the assembly level. While either of these methods provide for good solder ball formation, upon final assembly onto a planar, the device is extremely difficult to rework should some placement error cause package failure. The reworking difficulty arises from the fact that to disconnect the MCM-L component from the PCB, the solder ball and the solder pad to which it is connected must be reheated to melt the solder so that the component can be removed from the PCB. The melting of the solder usually destroys the critical uniformity of the solder ball and the mounting pad. Thus, the solder ball or the solder pad canner easily be reformed to provide for an effective connection when the PCB or component are reworked. Even if localized rework is utilized to remove the MCM-L, cleaning out the bottom surface metallurgy and redepositing solder to form solder balls is a time consuming and expensive process.

To over come this problem, some single chip carriers utilize expensive dielectric substrates that have a high transition temperature, e.g. from about 250° C. to about 450° C., and conventional IR reflow processes that allow the solder balls to be made of higher temperature solders, such as 10/90 Sn-Pb or 5/95 Sn-Pb solders. These solders have melting point temperatures that are less than the phase transition temperatures of the dielectric substrates to which they are being applied but that substantially exceed the melting point temperatures of the 63/73 Sn-Pb type solders that form the solder connector pads. Thus, when rework of the PCB board or the single chip carrier is desired, the board is heated to a temperature sufficient to melt the 63/63 Sn-Pb solder connector pad only, thereby allowing the chip to be removed from the board and leaving the higher temperature solder balls undamaged by the heating process.

The expensive dielectrics substrates that are typically used with these high temperature solders are made from materials, such as polytetrafluoroethylene or polyamides, which have phase transition temperatures capable of withstanding the higher application temperatures of the 10/90 Sn-Pb and 5/95 type solders. In contrast, however, these higher temperature solders cannot be utilized in low cost MCM-L's that use fiberglass resin-4 ("FR-4"), bis-maleamide triazine ("BT resin") or other conventional epoxy based dielectric substrate materials, which have phase transition temperatures of around 160° C. to 190° C. This is due to the fact that their phase transition temperatures are substantially less than the melting point temperatures of the higher temperature solders. As a result, attempting to form BGAs by infrared or vapor phase reflow using higher temperature solders could result in delamination and in some cases dielectric breakdown of the lower transition temperature dielectric substrates.

Therefore, as can readily be seen from the foregoing, it would be highly desirable to provide an improved apparatus and method for forming a solder ball interconnect mechanism comprising a high melting point temperature solder on a substrate such as a laminated multi chip module that has a phase transition temperature that is substantially lower than the melting point temperature of the solder used in the rest of the assembly in a manner eliminating or at least substantially reducing the above-mentioned problems. It is thus an object of the present invention to provide such improved connection apparatus and methods.

SUMMARY OF THE INVENTION

The present invention provides an integrated circuit module having a ball grid array deposited thereon. In a preferred embodiment thereof, an integrated circuit module, representatively a laminated multi chip module, is provided having a substrate portion with first and second opposite sides and a phase transition temperature. The substrate portion has a spaced series of vias extending transversely therethrough between first and second opposite sides, and a metallic coating, preferably copper, deposited on the interiors of the vias having exterior portions extending outwardly from the open ends of the vias along the first and second opposite sides of the substrate portion. The vias are preferably drill holes made by a conventional drilling process. A spaced series of externally disposed, generally ball-shaped metallic solder portions, which have a melting point temperature greater than the phase transition temperature of said substrate portion, are formed on at least one of the exterior portions of the metallic coating.

In one aspect of the embodiment just described, the integrated circuit's substrate may be either a fiberglass resin, FR-4, having a phase transition temperature of approximately 172° C. or a bis-maleamide triazine, BT, resin having a phase transition temperature of approximately 188° C.

In yet another aspect of this same embodiment, the solder portion may be comprised of a 10/90 Sn-Pb solder having a melting point temperature of approximately 290° C. or a 5/95 Sn-Pb solder having a melting point temperature of approximately 312° C. and may also be electrochemically deposited on the substrate material.

In another embodiment of the present invention, a circuit board apparatus with a module component is provided. The module component has a module component substrate portion with first and second opposite sides and a phase transition temperature. Additionally, the module component substrate portion has a spaced series of vias extending transversely therethrough between first and second opposite sides, and a metallic coating, preferably copper, deposited on the interiors of the vias. The metallic coating has exterior portions extending outwardly from the open ends of the vias along the first and second opposite sides of the module component substrate portion. Externally disposed on at least one of the exterior sides of the metallic coating are a spaced series of generally ball-shaped metallic solder portions, which have a melting point temperatures greater than the phase transition temperature of the module component substrate portion. Preferably, the solder portions are deposited on the module component by an electrochemical plating process. Formed on the first and second opposite sides of the circuit board substrate structure are a spaced series of solder connector pads that are registerable with and connectable to the module component's BGA by a conventional IR reflow process. The solder connector pads have a melting point temperature less than the melting point temperature of the BGA solder portion on the module component.

In another aspect of the embodiment just described, the substrate may be comprised of either a fiberglass resin, FR-4, having a phase transition temperature of approximately 172° C. or a bis-maleamide triazine, BT, resin having a phase transition temperature of approximately 188° C. In yet another aspect of this same embodiment, the solder portion may be comprised of a 10/90 Sn-Pb solder having a melting point temperature of approximately 290° C. or a 5/95 Sn-Pb solder having a melting point temperature of approximately 312° C. In contrast, however, the solder connector pads may be comprised of a 63/37 Sn-Pb solder having a melting point temperature less than the phase transition temperature of the substrate.

In another aspect of the present invention, there is provided an integrated circuit module fabricated by a method comprising the steps of: providing a substrate member having a phase transition temperature and having generally planar opposite first and second sides, and a spaced series of vias extending through the substrate member between the first and second sides opposite sides thereof; depositing a multi-layer metallic coating, preferably copper, on the substrate member with the multi-layer metallic coating having first portions extending along the interior side surfaces of the vias, and second portions having outer side surfaces connected to the first portions and extending outwardly therefrom along the first side of the substrate member; and forming on the outer side surfaces of the second portions of the multilayer metallic coating, preferably by an electrochemical plating process, a solder structure having a partially ball-shaped configuration and a melting point temperature greater than the phase transition temperature of the substrate.

In one aspect of the fabrication method, the substrate of the module component may be comprised of either a fiberglass resin, FR-4, having a phase transition temperature of approximately 172° C. or a bis-maleamide triazine, BT, resin having a phase transition temperature of approximately 188° C. In yet another aspect of this same embodiment, the solder portion may be comprised of a 10/90 Sn-Pb solder having a melting point temperature of approximately 290° C. or a 5/95 Sn-Pb solder having a melting point temperature of approximately 312° C.

In yet another embodiment, the fabrication method comprises the steps of: providing a multi chip module including a laminated substrate member having a phase transition temperature and a generally planar first and second opposite sides, and a spaced series of vias extending through the substrate member between the opposite first and second sides thereof; depositing a layer of copper on the substrate member with the layer of copper extending along the first and second opposite sides and interiors of the vias; placing a first mask on the first and second sides of the substrate member, over a portion of the copper layer thereon to form an exposed copper, electrical circuit pattern on the first and second opposite sides and around the interiors and the opposite open ends of the vias; placing a solder mask over the exposed copper, electrical circuit pattern; placing a second mask on the first and second sides of the substrate member, with the second mask having a series of holes therein offset from the vias and overlying sections of the copper layer on the first and second opposite sides of the substrate member; electrochemically depositing within the series of holes in the second mask, a solder structure having a partially ball-shaped configuration and a melting point temperature greater than the phase transition temperature of the substrate; stripping away the first and second masks to expose the portions of the copper layer on the first and second opposite sides; etching away the exposed portions of the copper layer thereby leaving the copper, electrical circuit pattern having the solder mask and the solder structure thereon; and then removing the solder mask from the copper, electrical circuit pattern.

As with the previous embodiments, the substrate in the fabrication method just described may be comprised of either a fiberglass resin, FR-4, having a phase transition temperature of approximately 172° C. or a bis-maleamide triazine, BT, resin having a phase transition temperature of approximately 188° C. While in yet another aspect of this same embodiment, the solder portion may be comprised of a 10/90 Sn-Pb solder having a melting point temperature of approximately 290° C. or a 5/95 Sn-Pb solder having a melting point temperature of approximately 312° C.

DETAILED DESCRIPTION

Figure 1:
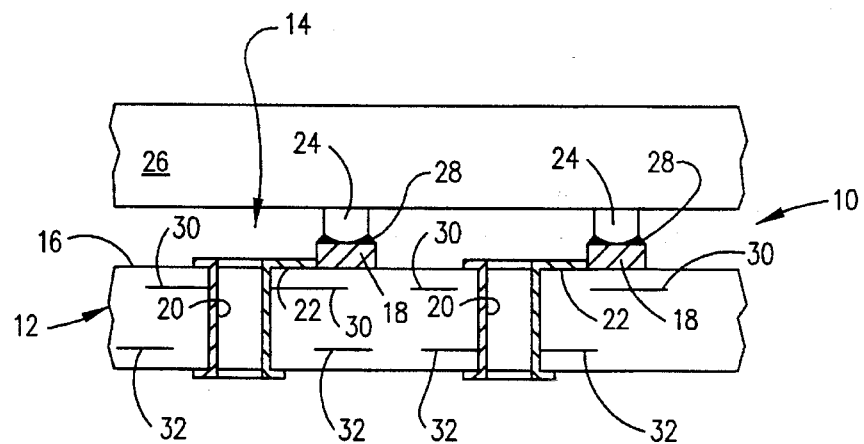
FIG. 1 (PRIOR ART) is a cross-sectional view of a portion of a conventional circuit board having offset arrays of electrically coupled vias and flat, surface mounted solder pads formed thereon and an electrical component having a ball grid array formed thereon.

Illustrated in FIG. 1 (PRIOR ART) is a cross-sectional view of a portion of a representative circuit board 10 having a substrate portion 12 made with conventional ball grid array ("BGA") connection circuitry 14 formed on a side surface 16 thereof. The connection circuitry 14 includes a spaced array of circular solder pads 18 that are offset from a corresponding spaced array of metallically lined vias 20 and electrically coupled thereto by a series of interstitial electrically conductive surface traces 22.

The pads 18 are used as circuit board connection areas for the generally ball-Shaped solder portions 24 depending in a mutually spaced, finely-pitched array from the underside of a representative BGA package 26 and arranged to be registrable with the pads 18 on the circuit board substrate 12. The solder balls and corresponding solder pads 18 in conventional applications are typically comprised of 63/37 Sn-Pb solder having a melting point temperature that is typically less than the phase transition temperature of the package 26. In such applications, the BGA package 26 is constructed from dielectric substrate materials, such as conventional FR-4, BT resin or other conventional epoxy based dielectric substrate materials that have phase transition temperatures greater than the melting point temperatures of the 63/37 solder and other similar type solders.

Alternatively, in applications using expensive dielectric materials such as polytetrafluoroethylene (PTFE) or polyamides, the package 26 may be comprised of solders, such as 10/90 Sn-Pb or 5/95 Sn-Pb that have melting point temperatures below the phase transition temperatures of the expensive dielectric materials which allow the circuit board 10 and the package 26 to be reworked if so desired. The solder balls in either of the applications are deposited on the package 26 component by conventional IR solder reflow processes.

Using a high accuracy pick and place machine (not shown), the package 26 is positioned against the circuit board 10 in a manner such that the ball-shaped leads 24 engage the top sides of the metallic solder pads 18. A conventional IR solder reflow process is used to solder the solder balls 24 to the underlying surface mounted pads 18 as at 28. The substrate member 12 is of a laminated constriction in which a plurality of interior "tiers" of circuitry portions 30,32 are operatively disposed.

Figure 2:
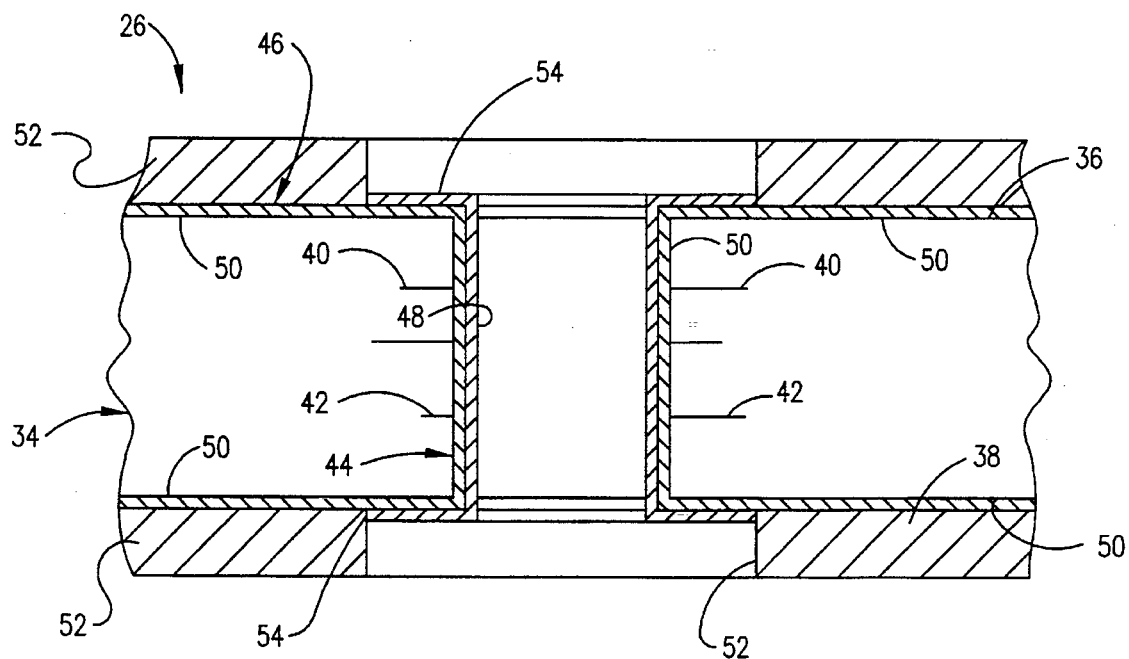
FIG. 2 is an enlarged scale simplified cross-sectional view through the laminated multi chip module with the first mask applied forming the copper, electrical circuit pattern.

Referring now to FIG. 2, the fabrication of the improved solder ball array on an integrated circuit module, representatively a MCM-L, is begun by forming an insulative substrate member 34 that has a top side 36 and a bottom side 38. Representatively, the substrate member 34 is of a laminated construction in which a plurality of interior "tiers" of circuitry portions 40,42 are operatively disposed. Preferably, the substrate material is formed from a conventional inexpensive substrate material such as FR-4, BT resin or other conventional epoxy based dielectric substrate materials, which have phase transition temperatures substantially less than the melting point temperature of the BGA solder balls 24 After the formation of the laminated substrate member 34, a spaced series of circularly cross-sectioned vias 44 are formed transversely through the substrate member 34, between its top and bottom sides 36,38 using precision drilling apparatus. As illustrated, the vias 44 are positioned to intersect facing end sections of selected interior circuit portions 40 and 42.

Next, as illustrated in FIG. 2 the interiors of each via 44 are plated with a metallic coating generally denoted by the reference numeral 146. The metallic coating 46 preferably comprises two layers of copper (illustrated as one layer)—a first bonding layer of electroless copper that extends along the top and bottom sides 36,38 of the substrate 34 and along the inner side surfaces 48 of the vias 44 using conventional process. Next, a desired copper, electrical circuit pattern (not shown) is exposed by applying a first conventional mask 52 and developing it so as to cover only those portions of the copper layer 50 which are to be removed later from the surface of the substrate material 34. Once the mask 52 is applied, an electroplated copper layer followed by a conventional solder etch resist layer 54 is then applied by conventional process over the exposed copper, electrical circuit pattern not covered by the first mask 52.

Figure 2A:
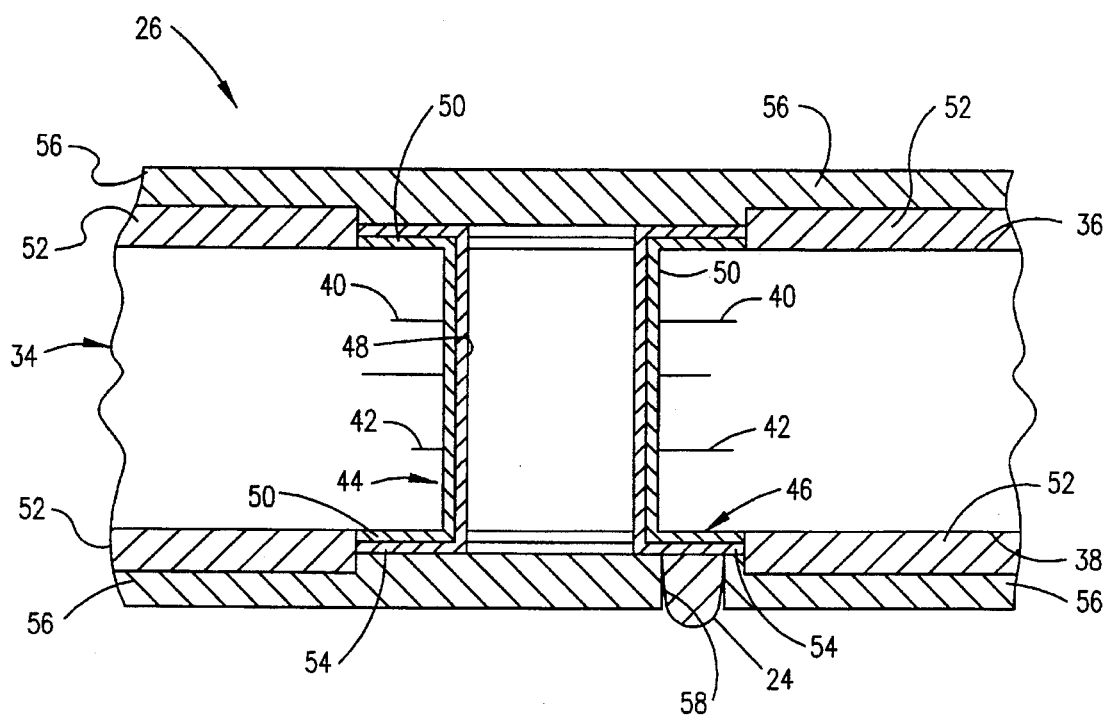
FIG. 2A is an enlarged scale simplified cross-sectional view through the laminated multi chip module with the second mask applied and with the BGA formed thereon.

Referring now to FIG. 2A, the ball array solder portions 24 (only one of which is shown in FIG. 2A) are formed in a unique manner which will now be described. A second mask 56 is placed on the top and bottom sides 36,38 of the substrate 34. The second mask 56 has spaced series of circular openings 58 (only one of which is shown in FIG. 2A) therein which are offset from and adjacent to the vias 44. After the second mask 56 is in place, the masked substrate 34 is placed in a conventional electrolytic bath apparatus (not illustrated).

The masked substrate 34 is attached to the cathode of the electrolytic bath in which the anode is comprised of a solder having a melting point temperature that is substantially greater than the phase transition temperature of the substrate 34. What is meant by "substantially greater" is a solder melting point temperature greater than that at which the substrate would begin a phase transition causing delamination or dielectric breakdown of the substrate material 34.

For example, if the substrate 34 is comprised of a conventional dielectric material such as FR-4, which has a as phase transition temperature of approximately 172° C. or BT resin, which has a phase transition temperature of approximately 188° C., then the anode would be comprised of a solder having a melting point temperature that exceeds those phase transition temperatures, such as a 10/90 Sn-PB, which has a melting point temperature of approximately 290° C. or a 5/95 Sn-Pb solder, which has a melting point temperature of approximately 312° C. Of course, it will be appreciated that the dielectric materials and the solders referenced above are given as examples and that several different materials and solders could be used provided the solder has a melting point temperature that is substantially greater than the phase transition material of the dielectric substrate.

The electrolytic bath is preferably a Stannous and Lead Fluoborate based bath wherein the bath is preferably comprised of: a 0.44M concentration of $Sn(BF_4)_2$, i.e., 129 g/l; a 0.14M concentration of $Pb(BF_4)_2$, i.e, 5.3 g/l; a 1.14 to 2.28M concentration of $HBF_4$, i.e., 100–200 g/l and a brightener or additive in a concentration of 5 g/l. Again, it will be appreciated that the electrolytic bath could be comprised of differing constituents and concentrations thereof which more appropriately correspond to the chosen solder used to form the BGA on the substrate.

The ratios of Stannous and Lead Fluoborate in solution are controlled to reflect the desired Sn/Pb ratio due to the fact that the Sn/Pb ratio in the bath is a primary factor in controlling the Sn/Pb deposit ratio. The solder ball array 24 thus formed is tightly controllable in terms of composition. In addition, due to the fundamental properties of the electrolytic plating, the solder ball array 24 meniscus is better defined resulting in better self-centering during subsequent reflow operations. Electrical current is applied, and the deposition of the solder onto the MCM-L substrate 34 is conducted until BGA solder portions 24 having the desired uniformity and size are formed.

Next, the first and second masks 52,56 are removed using conventional methods. The portions of the copper layer 50 on the top and bottom sides 36,38 of the substrate 34 that are not covered by the solder mask 54 are then etched away, thereby leaving a copper, electrical circuitry pattern. The solder mask 54 is then selectively stripped away using conventional processes which leaves the module ready for further assembly processing.

From the foregoing description, it is seen that the present invention provides apparatus for forming on an integrated circuit, a solder ball array having a high melting point temperature that is substantially greater than the phase transition temperature of dielectric substrate.

The foregoing detailed description is to be clearly understood as being given by way of illustration and example only, the spirit and scope of the present invention being limited solely by the appended claims.

What is claimed is:

1. An integrated circuit module, comprising:

a substrate portion with first and second opposite sides and a phase transition temperature, said substrate portion having a spaced series of vias extending transversely therethrough between first and second opposite sides, and a metallic coating deposited on interiors of said vias and having exterior portions extending outwardly from open ends of said vias along said first and second opposite sides of said substrate portion; and a spaced series of externally disposed, generally ball-shaped metallic solder portions formed on at least one of said exterior portions of said metallic coating, said solder portions having a melting point temperature substantially greater than said phase transition temperature of said substrate portion.

2. The integrated circuit module of claim 1 wherein said vias are drill holes.

3. The integrated circuit module of claim 1 wherein said metal coating is a multi-layer metallic coating of copper.

4. The integrated circuit module of claim 1 wherein the integrated circuit module is a laminated multi chip module.

5. The integrated circuit module of claim 1 wherein said substrate is comprised of a material selected from the group consisting of FR-4 having a phase transition temperature of approximately 172° C. and BT resin having a phase transition temperature of approximately 188° C.

6. The integrated circuit module of claim 1 wherein said solder portion is comprised of a solder selected from the group consisting of 10/90 Sn-Pb having a melting point temperature of approximately 290° C. and 5/95 Sn-Pb having a melting point temperature of approximately 312° C.

7. The integrated circuit module of claim 1 wherein said solder portions are electrochemically deposited on said substrate portion.

8. Circuit board apparatus comprising:

a module component having a module component substrate portion with first and second opposite sides and a phase transition temperature, said module component substrate portion having a spaced series of vias extending transversely therethrough between first and second opposite sides, and a metallic coating deposited on interiors of said vias and having exterior portions extending outwardly from open ends of said vias along said first and second opposite sides of said module component substrate portion;

a spaced series of externally disposed, generally ball-shaped metallic solder portions formed on at least one of said exterior portion of said first metallic coating, said solder portions having a melting point temperature substantially greater than said phase transition temperature of said module component substrate portion; and a circuit board substrate structure having first and second opposite sides, said circuit board substrate structure having a spaced series of solder connector pads that are registerable with and connectable to said solder portions on said module component, said solder connector pads having a melting point temperature less than said phase transition temperature of said module component substrate portion.

9. The circuit board apparatus of claim 8 wherein said vias are drill holes.

10. The circuit board apparatus of claim 8 wherein said metal coating is a multi-layer metallic coating of copper.

11. The circuit board apparatus of claim 8 wherein said module component is a laminated multi chip module.

12. The circuit board apparatus of claim 8 wherein said substrate is comprised of a material selected from the group consisting of FR-4 having a phase transition temperature of approximately 172° C. and BT resin having a phase transition temperature of approximately 188° C.

13. The circuit board apparatus of claim 8 wherein said solder portion is comprised of a solder selected from the group consisting of 10/90 Sn-Pb having a melting point temperature of approximately 290° C. and 5/95 Sn-Pb having a melting point temperature of approximately 312° C.

14. The circuit board apparatus of claim 8 wherein said solder portions are electrochemically deposited on said substrate portion.

15. The circuit board apparatus of claim 8 wherein said solder connector pads are comprised of a 63/37 Sn-Pb solder having a melting point temperature less than said phase transition temperature of said substrate.

16. An integrated circuit module fabricated by a method comprising the steps of:

providing a substrate member having a phase transition temperature and having generally planar opposite first and second sides, and a spaced series of vias extending through said substrate member between said opposite first and second sides thereof;

depositing a multi-layer metallic coating on said substrate member, said multi-layer metallic coating having first portions extending along interior side surfaces of said vias, and second portions connected to said first portions and extending outwardly therefrom along said first side of said substrate member, said second portions having outer side surfaces;

forming on said outer side surfaces of said second portions of said multi-layer metallic coating a solder structure having a partially ball-shaped configuration and a melting point temperature substantially greater than said phase transition temperature of said substrate.

17. The integrated circuit module according to claim 16 wherein said multi-layer metallic coating is comprised of copper.

18. The integrated circuit module according to claim 16 wherein said forming step is performed by an electrochemical plating process.

19. The integrated circuit module according to claim 16 wherein said substrate is comprised of a material selected from the group consisting of FR-4 having a phase transition temperature of approximately 172° C. and BT resin having a phase transition temperature of approximately 188° C.

20. The integrated circuit module according to claim 16 wherein said solder portion is comprised of a solder selected from the group consisting of 10/90 Sn-Pb having a melting point temperature of approximately 290° C. and 5/95 Sn-Pb having a melting point temperature of approximately 312° C.

21. Electronic apparatus fabricated by a method comprising the steps of:

providing a multi chip module including a laminated substrate member having a phase transition temperature and a generally planar first and second opposite sides, and a spaced series of vias extending through said substrate member between said opposite first and second sides thereof;

depositing a layer of copper on said substrate member, said layer of copper extending along said first and second opposite sides and interiors of said vias;

placing a first mask on said first and second sides of said substrate member, over a portion of said copper layer thereon to form an exposed copper, electrical circuit pattern on said first and second opposite sides and around said interiors and opposite open ends of said vias;

placing a solder mask over said exposed copper, electrical circuit pattern;

placing a second mask on said first and second sides of said substrate member, said second mask having a series of holes therein offset from said vias and overlying sections of said copper layer on said first and second Opposite sides of said substrate member;

electrochemically depositing within said series of holes in said second mask, a solder structure having a partially ball-shaped configuration and a melting point temperature substantially greater than said phase transition temperature of said substrate;

stripping away said first and second masks to expose said portions of said copper layer on said first and second opposite sides;

etching away said exposed portions of said copper layer thereby leaving said copper, electrical circuit pattern having said solder mask and said solder structure thereon; and removing said solder mask from said copper, electrical circuit pattern.

22. The electronic apparatus according to claim 21 wherein said substrate is comprised of a material selected from the group consisting of FR-4 having a phase transition temperature of approximately 172° C. and BT resin having phase transition temperature of approximately 188° C.

23. The electronic apparatus according to claim 21 wherein said solder portion is comprised of a solder selected from the group consisting of 10/90 Sn-Pb having a melting point temperature of approximately 290° C. and 5/95 Sn-Pb having a melting point temperature of approximately 312° C.

* * * * *